(12) United States Patent
Yasutomo (10) Patent No.: US 11,394,353 B2
(45) Date of Patent: Jul. 19, 2022

(54) POWER AMPLIFIER CIRCUIT

(71) Applicant: Murata Manufacturing Co., Ltd., Kyoto (JP)

(72) Inventor: Yoshiki Yasutomo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 16/950,951

(22) Filed: Nov. 18, 2020

(65) Prior Publication Data
US 2021/0159862 A1 May 27, 2021

(30) Foreign Application Priority Data
Nov. 21, 2019 (JP) .............................. JP2019-210782

(51) Int. Cl.
*H03F 3/191* (2006.01)
*H03F 3/21* (2006.01)
*H03F 1/56* (2006.01)

(52) U.S. Cl.
CPC ............... *H03F 3/21* (2013.01); *H03F 1/565* (2013.01); *H03F 2200/387* (2013.01); *H03F 2200/451* (2013.01)

(58) Field of Classification Search
CPC ...................................................... H03F 3/191
USPC ................................................. 330/302, 305
See application file for complete search history.

(56) References Cited

U.S. PATENT DOCUMENTS

| | | | | |
|---|---|---|---|---|
| 7,679,438 | B2* | 3/2010 | Tateoka | H03F 3/189 330/126 |
| 8,149,050 | B2* | 4/2012 | Cabanillas | H03F 3/72 330/51 |
| 9,479,128 | B2* | 10/2016 | Xuan | H03F 1/56 |
| 10,594,273 | B2* | 3/2020 | Yanagihara | H03F 3/213 |
| 2006/0267682 | A1* | 11/2006 | Grebennikov | H03F 1/0277 330/51 |
| 2008/0284539 | A1* | 11/2008 | Tateoka | H03F 1/56 333/124 |

FOREIGN PATENT DOCUMENTS

JP 2008-118624 A 5/2008

* cited by examiner

*Primary Examiner* — Henry Choe
(74) *Attorney, Agent, or Firm* — Pearne & Gordon LLP (57) ABSTRACT

A power amplifier circuit includes a power amplifier and an output matching circuit that includes a first capacitor and a switch unit. The first capacitor has a first end electrically connected to an output end of the power amplifier. The switch unit includes a first input terminal, a second input terminal, a first output terminal, and a second output terminal. The switch unit causes the first input terminal to be connected to the first output terminal and causes the second input terminal to be connected to the second output terminal in a first operation mode of the power amplifier, and causes the first input terminal to be connected to the second output terminal and causes the second input terminal to be open or to be connected to the first output terminal in a second operation mode of the power amplifier.

16 Claims, 8 Drawing Sheets

POWER AMPLIFIER CIRCUIT

CROSS REFERENCE TO RELATED APPLICATION

This application claims priority from Japanese Patent Application No. 2019-210782 filed on Nov. 21, 2019. The content of this application is incorporated herein by reference in its entirety.

BACKGROUND OF THE DISCLOSURE

1. Field of the Disclosure

The present disclosure relates to a power amplifier circuit.

2. Description of the Related Art

Mobile communication terminals, such as mobile phones, use a power amplifier circuit that amplifies a radio frequency (RF) signal to be transmitted to a base station. In a power amplifier circuit, an output matching circuit may be provided on an output side of an amplifier element, such as a transistor, so as to efficiently output an RF signal from the amplifier element.

For example, Japanese Unexamined Patent Application Publication No. 2008-118624 describes an RF amplifier device including an amplifier element and an output matching circuit connected to an output side of the amplifier element. The output matching circuit includes a capacitor that is connected in parallel to a signal path of an amplified signal outputted from the amplifier element, and a switch that causes the capacitor to be open or to be connected to ground. The switch causes the capacitor to be open to increase a load impedance when the power level of the amplifier element is low, and causes the capacitor to be connected to ground to decrease the load impedance when the power level of the amplifier element is high. In this way, the impedance at an output end of the amplifier element is adjusted on the basis of the power level of the amplifier element.

BRIEF SUMMARY OF THE DISCLOSURE

As described above, the capacitor having the configuration described in Japanese Unexamined Patent Application Publication No. 2008-118624 is connected in parallel to the signal path and functions to decrease the impedance when the power level of the amplifier element is high. However, when the power level of the amplifier element is low, the capacitor is open and does not perform any function. Thus, the RF amplifier device according to Japanese Unexamined Patent Application Publication No. 2008-118624 uses a component that functions only in a limited condition where the power level of the amplifier element is high, which is inefficient from the viewpoint of circuit design.

Accordingly, it is an object of the present disclosure to provide a power amplifier circuit capable of adjusting an impedance conversion ratio of impedance matching in each of a plurality of operation modes, and to achieve both acquisition of output in a high-power mode and reduction of current consumption in a low-power mode.

According to preferred embodiments of the present disclosure, a power amplifier circuit includes a power amplifier that amplifies an input signal and outputs an amplified signal, and an output matching circuit electrically connected to an output end of the power amplifier. The output matching circuit includes a first capacitor and a switch unit. The first capacitor has a first end electrically connected to the output end of the power amplifier. The switch unit includes a first input terminal electrically connected to a second end of the first capacitor, a second input terminal electrically connected to the output end of the power amplifier, a first output terminal electrically connected to ground, and a second output terminal electrically connected to an output end of the output matching circuit. The switch unit causes the first input terminal to be connected to the first output terminal and causes the second input terminal to be connected to the second output terminal in a first operation mode of the power amplifier, and causes the first input terminal to be connected to the second output terminal and causes the second input terminal to be open or to be connected to the first output terminal in a second operation mode of the power amplifier.

According to preferred embodiments of the present disclosure, it is possible to provide a power amplifier circuit capable of adjusting an impedance conversion ratio of impedance matching in each of a plurality of operation modes, and to achieve both acquisition of output in a high-power mode and reduction of current consumption in a low-power mode.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Preferred embodiments of the present disclosure will be described with reference to the attached drawings. In the individual figures, those denoted by the same reference numerals have the same or similar configurations.

First Embodiment

Figure 1:
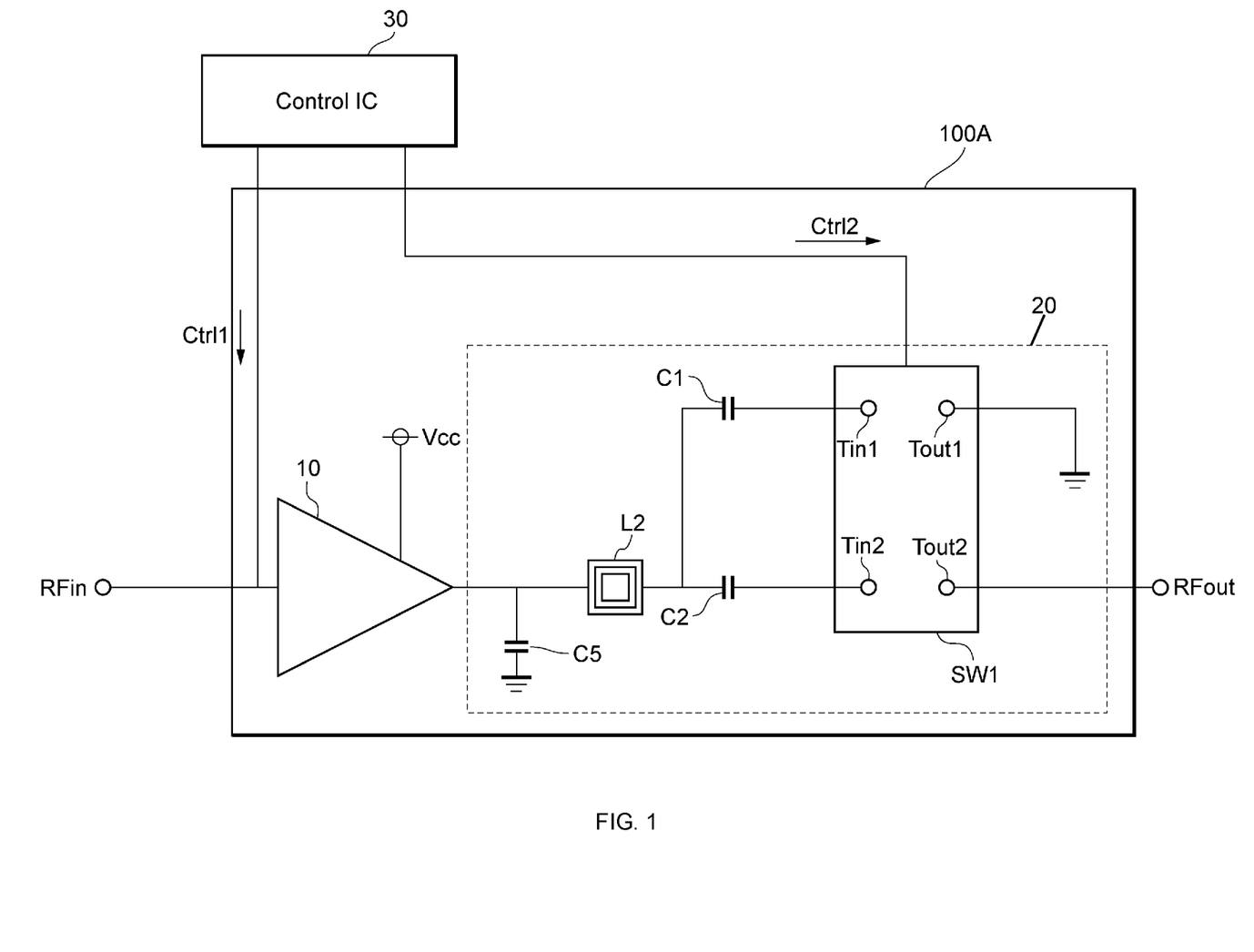
FIG. 1 is a schematic configuration diagram of a power amplifier circuit according to a first embodiment.

FIG. 1 is a schematic configuration diagram of a power amplifier circuit 100A according to a first embodiment. As illustrated in FIG. 1, the power amplifier circuit 100A includes, for example, a power amplifier 10 and an output matching circuit 20. The power amplifier circuit 100A may be formed of one chip as a power amplifier module. Although not illustrated, the power amplifier circuit 100A may include an input matching circuit.

The power amplifier 10, which is used in a mobile communication terminal such as a mobile phone, amplifies the power of an input signal RFin to a level sufficient to transmit the signal to a base station, and outputs a resulting signal as an amplified signal RFout. The power amplifier 10 includes, for example, a transistor (an amplifier) that receives the input signal RFin supplied from an input terminal, amplifies the input signal RFin, and outputs the amplified signal RFout. The transistor may be a bipolar transistor or a field effect transistor (FET). The power amplifier 10 is connected, for example, at the collector end or drain end thereof, to a power supply terminal Vcc via a choke inductor, which is not illustrated.

The power amplifier 10 is connected to a control integrated circuit (IC) 30 through one or a plurality of control lines and is supplied with a control signal Ctrl1 from the control IC 30. Here, the control IC 30 may be provided in one chip integrally with the power amplifier circuit 100A or may be provided in a chip different from the chip in which the power amplifier circuit 100A is provided. The control signal Ctrl1 may be, for example, a signal for controlling an operation mode of the power amplifier 10. The operation mode may be defined by the power level of an output and may include, for example, a high-power mode (a first operation mode) in which the power level of an output is high and a low-power mode (a second operation mode) in which the power level of an output is low.

The output matching circuit 20 is electrically connected to an output end of the power amplifier 10, adjusts an output impedance of the power amplifier 10, and achieves impedance matching with a circuit in a subsequent stage. The output matching circuit 20 includes, for example, capacitors C1, C2, and C5, an inductor L2, and a switch SW1 (a switch unit).

One end of the inductor L2 is electrically connected to the output end of the power amplifier 10. One end of the capacitor C5 is electrically connected between the output end of the power amplifier 10 and the one end of the inductor L2, and the other end of the capacitor C5 is electrically connected to ground. The capacitor C1 is an example of a first capacitor. One end of the capacitor C1 is electrically connected to the output end of the power amplifier 10. Specifically, the one end of the capacitor C1 is electrically connected to the other end of the inductor L2. The other end of the capacitor C1 is electrically connected to a first input terminal Tin1 of the switch SW1. The capacitor C2 is an example of a second capacitor. One end of the capacitor C2 is electrically connected to the output end of the power amplifier 10. Specifically, the one end of the capacitor C2 is electrically connected to the other end of the inductor L2. The other end of the capacitor C2 is electrically connected to a second input terminal Tin2 of the switch SW1. This circuit configuration is an example. The output matching circuit 20 may have another circuit configuration.

The switch SW1 includes the first input terminal Tin1, the second input terminal Tin2, a first output terminal Tout1, and a second output terminal Tout2. The first input terminal Tin1 and the second input terminal Tin2 are electrically connected to the output end of the power amplifier 10. The first output terminal Tout1 is electrically connected to ground. The second output terminal Tout2 is electrically connected to an output end of the output matching circuit 20. The switch SW1 is connected to the control IC 30 through one or a plurality of control lines and is supplied with a control signal Ctrl2, which controls switching of the switch SW1, from the control IC 30. The control signal Ctrl2 may correspond to, for example, the operation mode of the power amplifier 10. On the basis of the control signal Ctrl2, the switch SW1 causes each of the first input terminal Tin1 and the second input terminal Tin2 to be open or to be selectively connected to the first output terminal Tout1 or the second output terminal Tout2.

When the power amplifier 10 operates in the high-power mode on the basis of the control signal Ctrl1, for example, the switch SW1 causes the first input terminal Tin1 to be connected to the first output terminal Tout1 and causes the second input terminal Tin2 to be connected to the second output terminal Tout2 on the basis of the control signal Ctrl2. Accordingly, in the high-power mode, the capacitor C1 is connected in parallel to the path of an amplified signal and functions as an impedance conversion element of the output matching circuit 20. In the high-power mode, the capacitor C2 is connected in series to the path of the amplified signal and functions as a capacitor for removing a direct current (DC) component from the amplified signal.

When the power amplifier 10 operates in the low-power mode on the basis of the control signal Ctrl1, for example, the switch SW1 causes the first input terminal Tin1 to be connected to the second output terminal Tout2 and causes the second input terminal Tin2 to be connected to the first output terminal Tout1 on the basis of the control signal Ctrl2. Accordingly, in the low-power mode, the capacitor C1 is connected in series to the path of an amplified signal and functions as a capacitor for removing a DC component from the amplified signal. In the low-power mode, the capacitor C2 is connected in parallel to the path of the amplified signal and functions as an impedance conversion element of the output matching circuit 20.

Figure 2:
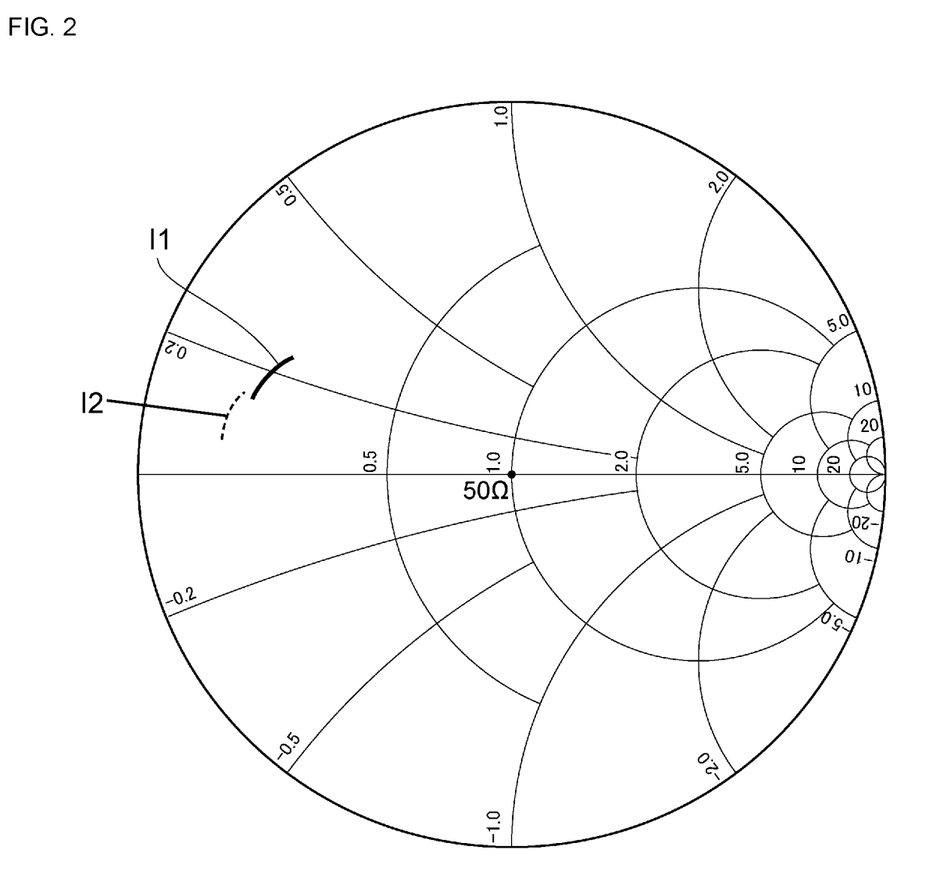
FIG. 2 is a Smith chart illustrating the loci of impedances of an output matching circuit according to the first embodiment.

FIG. 2 is a Smith chart illustrating the loci of impedances of the output matching circuit 20 according to the first embodiment. A solid line I1 represents the locus of the impedance of the output matching circuit 20 in the low-power mode, and a broken line I2 represents the locus of the impedance of the output matching circuit 20 in the high-power mode. In each locus, the frequency ranges from about 1.4 GHz to about 1.5 GHz in one example. This enables a higher impedance to be achieved in the low-power mode than in the high-power mode. Thus, a higher impedance enables a smaller current to be used to obtain the same power.

As described above, in the high-power mode, the capacitor C1 functions as a capacitor for dropping a specific frequency component of the amplified signal to ground, and the capacitor C2 functions as a capacitor for removing a DC component from the amplified signal. In the low-power mode, the capacitor C1 functions as a capacitor for removing a DC component from the amplified signal, and the capacitor C2 functions as an impedance conversion element of the output matching circuit 20. Thus, in the power amplifier circuit 100A, the capacitance value of the capacitor C1 and the capacitance value of the capacitor C2 can be set so as to optimize the impedance in each of the high-power mode and the low-power mode. In particular, the capacitance value of the capacitor C1 may be greater than the capacitance value of the capacitor C2. For example, the capacitance value of the capacitor C1 may be set to several tens of pF (for example, about 20 pF). The capacitance value of the capacitor C2 may be set to several pF (for example, about 3 to 5 pF). In this way, in the power amplifier circuit 100A, the capacitance value of each of the capacitors C1 and C2 can be set so as to optimize the impedance of the output matching circuit 20.

When the power amplifier 10 operates in the low-power mode on the basis of the control signal Ctrl1, for example, the switch SW1 may cause the first input terminal Tin1 to be connected to the second output terminal Tout2 and may cause the second input terminal Tin2 to be open on the basis of the control signal Ctrl2.

Figure 3:
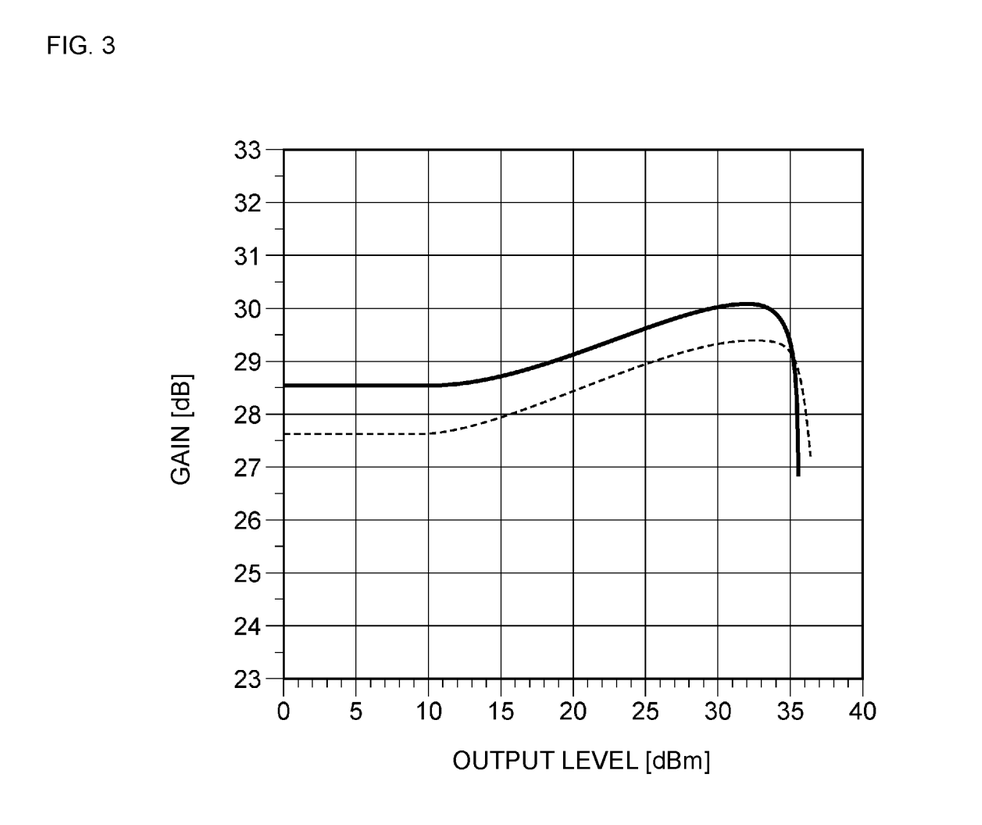
FIG. 3 is a graph illustrating simulation results of the gain of the power amplifier circuit according to the first embodiment.

FIG. 3 is a graph illustrating simulation results of the gain of the power amplifier circuit 100A according to the first embodiment. In FIG. 3, the horizontal axis represents the output level (dBm) of an RF signal, and the vertical axis represents the gain (dB). In FIG. 3, the solid line represents a simulation result in the high-power mode, and the broken line represents a simulation result in the low-power mode. As illustrated in FIG. 3, in the range in which the output level is about 35 dBm or lower, the gain in the high-power mode is mostly higher than the gain in the low-power mode.

Figure 4:
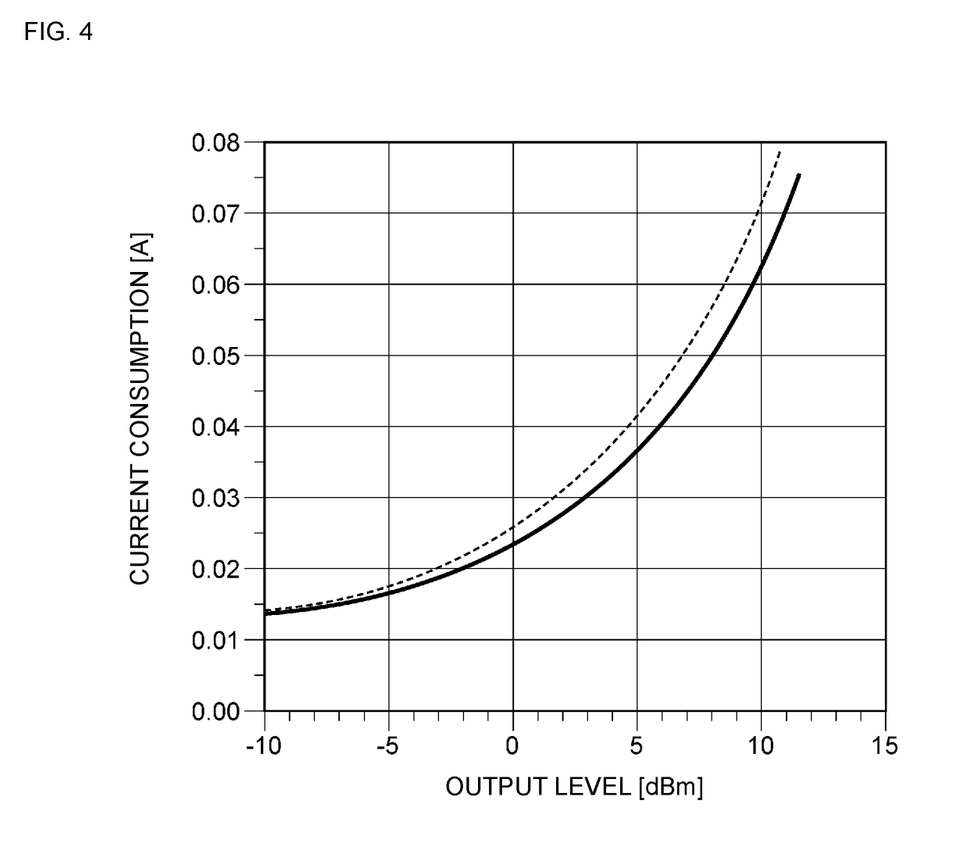
FIG. 4 is a graph illustrating simulation results of the current consumption of the power amplifier circuit according to the first embodiment.

FIG. 4 is a graph illustrating simulation results of the current consumption of the power amplifier circuit 100A according to the first embodiment. In FIG. 4, the horizontal axis represents the output level (dBm) of an RF signal, and the vertical axis represents the current consumption (A). In FIG. 4, the broken line represents a simulation result in the high-power mode, and the solid line represents a simulation result in the low-power mode. It is understood from FIG. 4 that the current consumption in the high-power mode (low impedance) is greater than the current consumption in the low-power mode (high impedance). Thus, as a result of switching the capacitance for impedance matching in the manner according to preferred embodiments of the present disclosure, the output impedance of the power amplifier 10 can be adjusted and the current consumption in the low-power mode can be reduced.

First Modification Example of First Embodiment

Figure 5:
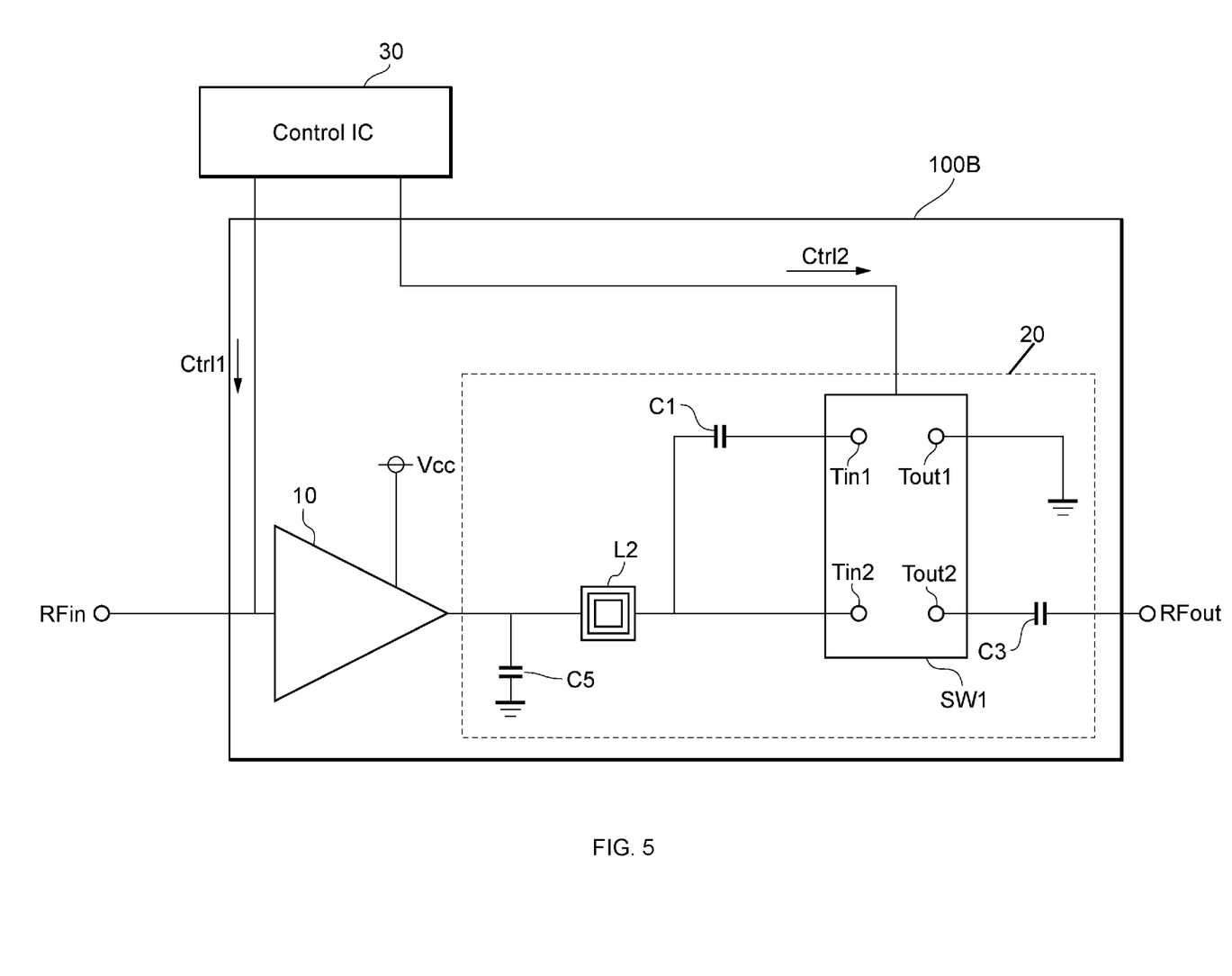
FIG. 5 is a schematic configuration diagram of a power amplifier circuit according to a first modification example of the first embodiment.

FIG. 5 is a schematic configuration diagram of a power amplifier circuit 100B according to a first modification example of the first embodiment. The output matching circuit 20 of the power amplifier circuit 100B includes a capacitor C3. The capacitor C3 is an example of a third capacitor. The output matching circuit 20 does not necessarily include the capacitor C2.

One end of the capacitor C3 is electrically connected to the second output terminal Tout2 of the switch SW1, and the other end of the capacitor C3 is electrically connected to the output end of the output matching circuit 20.

When the power amplifier 10 operates in the high-power mode on the basis of the control signal Ctrl1, for example, the switch SW1 causes the first input terminal Tin1 to be connected to the first output terminal Tout1 and causes the second input terminal Tin2 to be connected to the second output terminal Tout2 on the basis of the control signal Ctrl2. Accordingly, in the high-power mode, the capacitor C1 is connected in parallel to the path of an amplified signal and functions as an impedance conversion element of the output matching circuit 20. In the high-power mode, the capacitor C3 is connected in series to the path of the amplified signal and functions as a capacitor for removing a DC component from the amplified signal.

When the power amplifier 10 operates in the low-power mode on the basis of the control signal Ctrl1, for example, the switch SW1 causes the first input terminal Tin1 to be connected to the second output terminal Tout2 and causes the second input terminal Tin2 to be open on the basis of the control signal Ctrl2. Accordingly, in the low-power mode, the capacitor C1 and the capacitor C3 are connected in series to the path of the amplified signal and form a combined capacitance, which functions as a capacitor for removing a DC component from the amplified signal.

Second Embodiment

Figure 6:
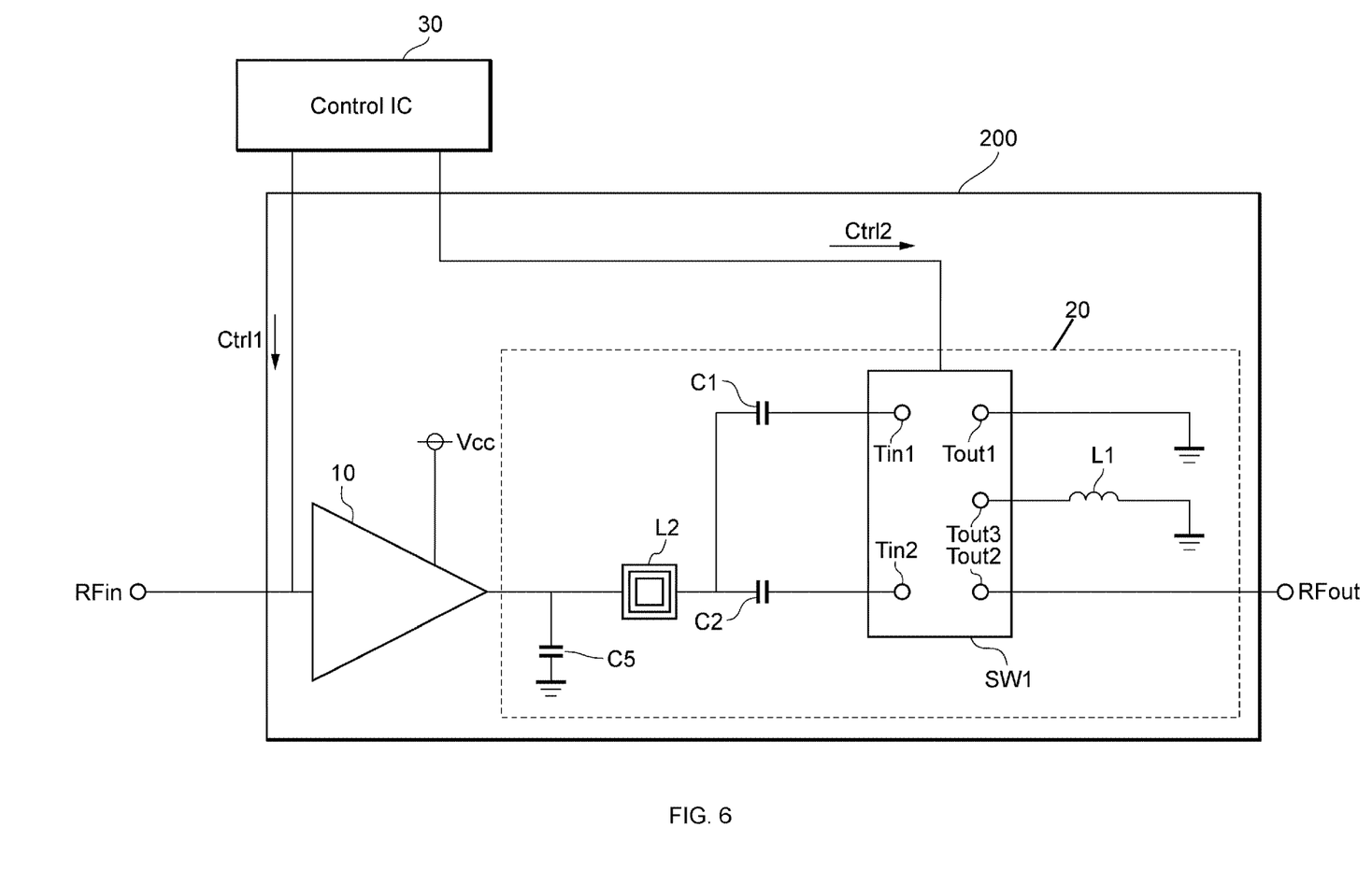
FIG. 6 is a schematic configuration diagram of a power amplifier circuit according to a second embodiment.

FIG. 6 is a schematic configuration diagram of a power amplifier circuit 200 according to a second embodiment. In the power amplifier circuit 200, the switch SW1 of the output matching circuit 20 further includes a third output terminal Tout3, and the output matching circuit 20 further includes an inductor L1. One end of the inductor L1 is electrically connected to the third output terminal Tout3 of the switch SW1, and the other end of the inductor L1 is electrically connected to ground.

When the power amplifier 10 operates in the high-power mode on the basis of the control signal Ctrl1, for example, the switch SW1 causes the first input terminal Tin1 to be connected to the first output terminal Tout1 and causes the second input terminal Tin2 to be connected to the second output terminal Tout2 on the basis of the control signal Ctrl2. Accordingly, in the high-power mode, the capacitor C1 is connected in parallel to the path of an amplified signal and functions as an impedance conversion element of the output matching circuit 20. In the high-power mode, the capacitor C2 is connected in series to the path of the amplified signal and functions as a capacitor for removing a DC component from the amplified signal.

When the power amplifier 10 operates in the low-power mode on the basis of the control signal Ctrl1, for example, the switch SW1 causes the first input terminal Tin1 to be connected to the second output terminal Tout2 and causes the second input terminal Tin2 to be connected to the first output terminal Tout1 or the third output terminal Tout3 on the basis of the control signal Ctrl2. Accordingly, in the low-power mode, the capacitor C1 is connected in series to the path of an amplified signal and functions as a capacitor for removing a DC component from the amplified signal. In the low-power mode, when the second input terminal Tin2 is connected to the first output terminal Tout1, the capacitor C2 is connected in parallel to the path of the amplified signal and functions as an impedance conversion element of the output matching circuit 20. In the low-power mode, when the second input terminal Tin2 is connected to the third output terminal Tout3, a series resonance circuit formed of the capacitor C2 and the inductor L1 is connected in parallel to the path of the amplified signal and is capable of attenuating a specific frequency (resonant frequency) component of the amplified signal.

Third Embodiment

Figure 7:
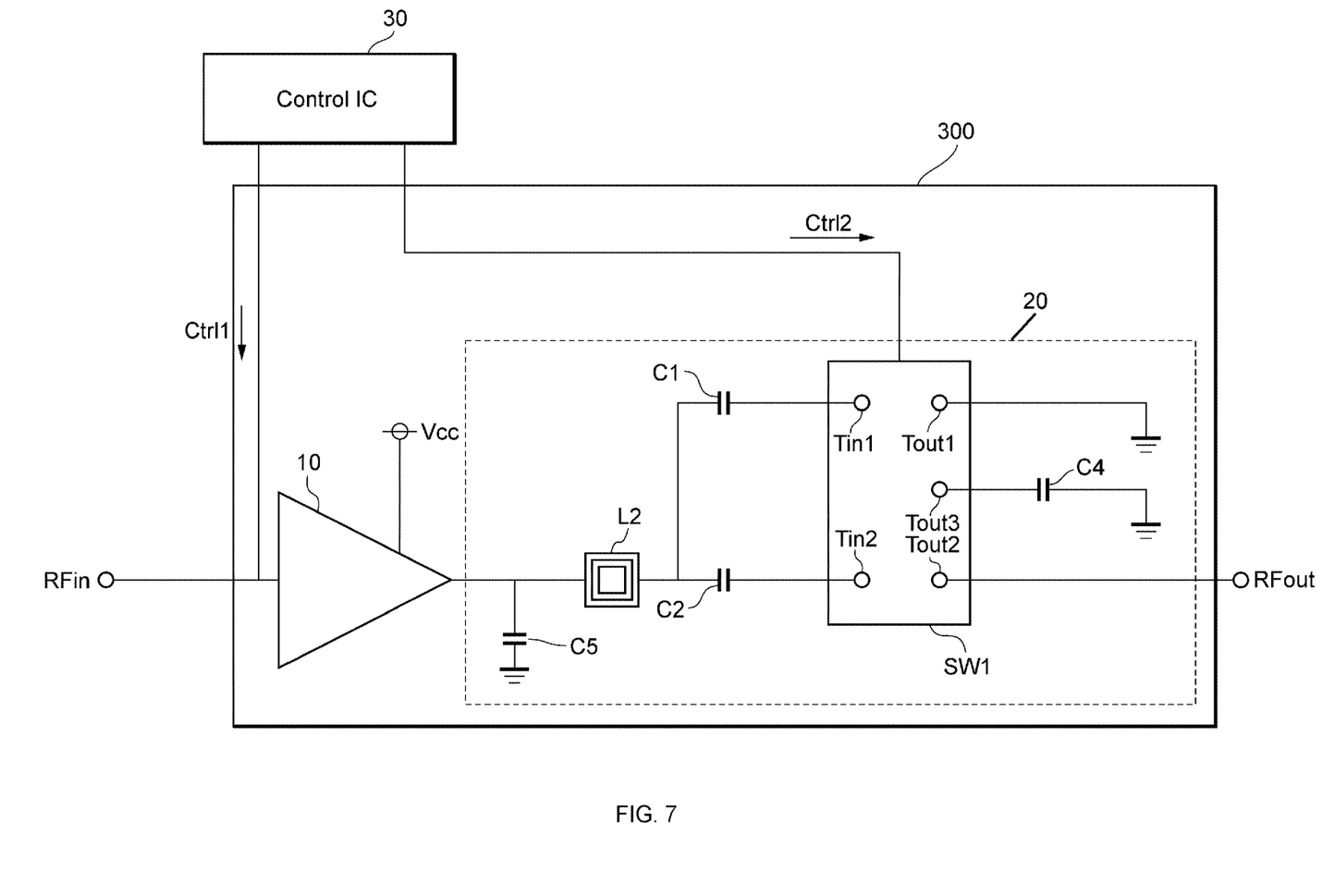
FIG. 7 is a schematic configuration diagram of a power amplifier circuit according to a third embodiment.

FIG. 7 is a schematic configuration diagram of a power amplifier circuit 300 according to a third embodiment. In the power amplifier circuit 300, the switch SW1 of the output matching circuit 20 further includes the third output terminal Tout3, and the output matching circuit 20 further includes a capacitor C4 (an example of a fourth capacitor). One end of the capacitor C4 is electrically connected to the third output terminal Tout3 of the switch SW1, and the other end of the capacitor C4 is electrically connected to ground.

When the power amplifier 10 operates in the high-power mode on the basis of the control signal Ctrl1, for example, the switch SW1 causes the first input terminal Tin1 to be connected to the first output terminal Tout1 and causes the second input terminal Tin2 to be connected to the second output terminal Tout2 on the basis of the control signal Ctrl2. Accordingly, in the high-power mode, the capacitor C1 is connected in parallel to the path of an amplified signal and functions as an impedance conversion element of the output matching circuit 20. In the high-power mode, the capacitor C2 is connected in series to the path of the amplified signal and functions as a capacitor for removing a DC component from the amplified signal.

When the power amplifier 10 operates in the low-power mode on the basis of the control signal Ctrl1, for example, the switch SW1 causes the first input terminal Tin1 to be connected to the second output terminal Tout2 and causes the second input terminal Tin2 to be connected to the first output terminal Tout1 or the third output terminal Tout3 on the basis of the control signal Ctrl2. Accordingly, in the low-power mode, the capacitor C1 is connected in series to the path of an amplified signal and functions as a capacitor for removing a DC component from the amplified signal. In the low-power mode, when the second input terminal Tin2 is connected to the first output terminal Tout1, the capacitor C2 is connected in parallel to the path of the amplified signal and functions as an impedance conversion element of the output matching circuit 20. In the low-power mode, when the second input terminal Tin2 is connected to the third output terminal Tout3, a combined capacitance formed of the capacitor C2 and the capacitor C4 is connected in parallel to the path of the amplified signal and functions as an impedance conversion element of the output matching circuit 20.

Fourth Embodiment

Figure 8:
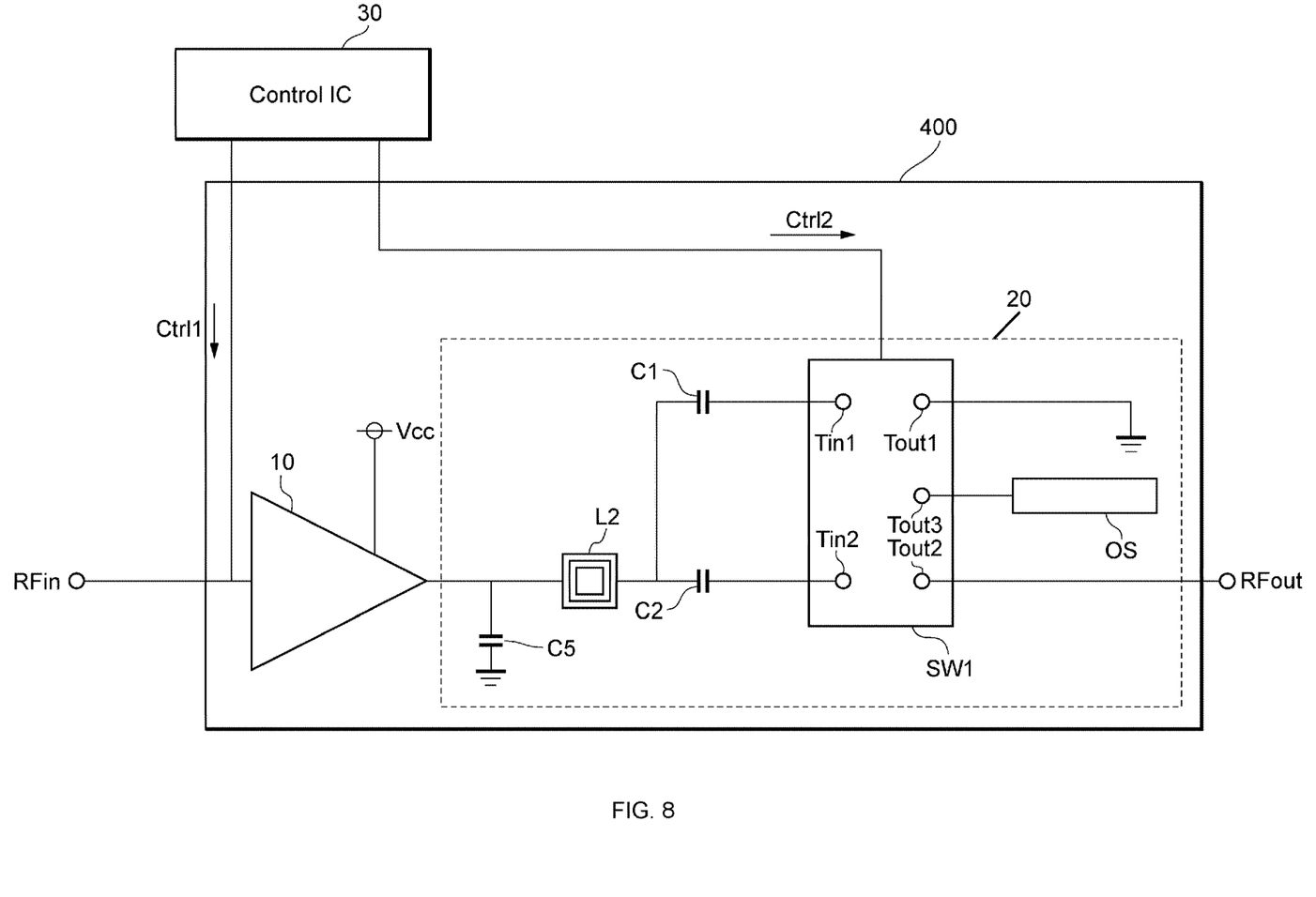
FIG. 8 is a schematic configuration diagram of a power amplifier circuit according to a fourth embodiment.

FIG. 8 is a schematic configuration diagram of a power amplifier circuit 400 according to a fourth embodiment. In the power amplifier circuit 400, the switch SW1 of the output matching circuit 20 further includes the third output terminal Tout3, and the output matching circuit 20 further includes an open stub OS. One end of the open stub OS is electrically connected to the third output terminal Tout3 of the switch SW1.

When the power amplifier 10 operates in the high-power mode on the basis of the control signal Ctrl1, for example, the switch SW1 causes the first input terminal Tin1 to be connected to the first output terminal Tout1 and causes the second input terminal Tin2 to be connected to the second output terminal Tout2 on the basis of the control signal Ctrl2. Accordingly, in the high-power mode, the capacitor C1 is connected in parallel to the path of an amplified signal and functions as a capacitor for dropping a specific frequency component of the amplified signal to ground. In the high-power mode, the capacitor C2 is connected in series to the path of the amplified signal and functions as a capacitor for removing a DC component from the amplified signal.

When the power amplifier 10 operates in the low-power mode on the basis of the control signal Ctrl1, for example, the switch SW1 causes the first input terminal Tin1 to be connected to the second output terminal Tout2 and causes the second input terminal Tin2 to be connected to the first output terminal Tout1 or the third output terminal Tout3 on the basis of the control signal Ctrl2. Accordingly, in the low-power mode, the capacitor C1 is connected in series to the path of an amplified signal and functions as a capacitor for removing a DC component from the amplified signal. In the low-power mode, when the second input terminal Tin2 is connected to the first output terminal Tout1, the capacitor C2 is connected in parallel to the path of the amplified signal and functions as a capacitor for dropping a specific frequency component of the amplified signal to ground. In the low-power mode, when the second input terminal Tin2 is connected to the third output terminal Tout3, a series circuit formed of the capacitor C2 and the open stub OS is connected in parallel to the path of the amplified signal and is capable of attenuating a specific frequency (resonant frequency) component of the amplified signal.

Various embodiments have been described above. A power amplifier circuit according to an embodiment includes a power amplifier that amplifies an input signal and outputs an amplified signal, and an output matching circuit connected to an output end of the power amplifier. The output matching circuit includes a first capacitor and a switch unit. The first capacitor has a first end electrically connected to the output end of the power amplifier. The switch unit includes a first input terminal electrically connected to a second end of the first capacitor, a second input terminal electrically connected to the output end of the power amplifier, a first output terminal electrically connected to ground, and a second output terminal electrically connected to an output end of the output matching circuit. The switch unit causes the first input terminal to be connected to the first output terminal and causes the second input terminal to be connected to the second output terminal in a first operation mode of the power amplifier, and causes the first input terminal to be connected to the second output terminal and causes the second input terminal to be open or to be connected to the first output terminal in a second operation mode of the power amplifier. Accordingly, in the first operation mode of the power amplifier, the first capacitor is connected in parallel to the path of the amplified signal of the power amplifier and functions as a capacitor for dropping a specific frequency component of the amplified signal to ground. In the second operation mode of the power amplifier, the first capacitor is connected in series to the path of the amplified signal and functions as a capacitor for removing a DC component from the amplified signal. Thus, a power amplifier circuit capable of adjusting an impedance conversion ratio of impedance matching in each of a plurality of operation modes is provided, and both acquisition of output in the first operation mode and reduction of current consumption in the second operation mode are achieved.

In the above-described power amplifier circuit, the output matching circuit may further include a second capacitor, the second capacitor may have a first end electrically connected to the output end of the power amplifier, and the second capacitor may have a second end electrically connected to the second input terminal of the switch unit. Accordingly, in the first operation mode of the power amplifier, the second capacitor is connected in series to the path of the amplified signal and functions as a capacitor for removing a DC component from the amplified signal. In the second operation mode of the power amplifier, when the second input terminal is connected to the first output terminal, the second capacitor is connected in parallel to the path of the amplified signal of the power amplifier and functions as a capacitor for dropping a specific frequency component of the amplified signal to ground. Thus, the second capacitor is capable of performing a function of a capacitor in both the first operation mode and the second operation mode and thus makes it possible to set an appropriate impedance in the plurality of operation modes.

In the above-described power amplifier circuit, the output matching circuit may further include a third capacitor, the third capacitor may have a first end electrically connected to the second output terminal of the switch unit, and the third capacitor may have a second end electrically connected to the output end of the output matching circuit. Accordingly, in the first operation mode of the power amplifier, the third capacitor is connected in series to the path of the amplified signal and functions as a capacitor for removing a DC component from the amplified signal. In the second operation mode of the power amplifier, the third capacitor is connected in series to the first capacitor, and a combined capacitance of the first capacitor and the third capacitor functions as a capacitor for removing a DC component from the amplified signal. Thus, the third capacitor performs a function of a capacitor in both the first operation mode and the second operation mode and thus makes it possible to set an appropriate impedance in the plurality of operation modes.

In the above-described power amplifier circuit, the output matching circuit may further include an inductor, the switch unit may further include a third output terminal electrically connected to ground, the inductor may have a first end electrically connected to the third output terminal, the inductor may have a second end electrically connected to ground, and the switch unit may cause the first input terminal to be connected to the second output terminal and may cause the second input terminal to be open or to be connected to the first output terminal or the third output terminal in the second operation mode of the power amplifier. Accordingly, it becomes possible to set an appropriate impedance in the plurality of operation modes of the power amplifier circuit, and the impedance can be adjusted easily.

In the above-described power amplifier circuit, the output matching circuit may further include a fourth capacitor, the switch unit may further include a third output terminal electrically connected to ground, the fourth capacitor may have a first end electrically connected to the third output terminal, the fourth capacitor may have a second end electrically connected to ground, and the switch unit may cause the first input terminal to be connected to the second output terminal and may cause the second input terminal to be open or to be connected to the first output terminal or the third output terminal in the second operation mode of the power amplifier. Accordingly, the impedance of the power amplifier circuit can be adjusted easily.

In the above-described power amplifier circuit, the output matching circuit may further include an open stub, the switch unit may further include a third output terminal electrically connected to the open stub, the open stub may have a first end electrically connected to the third output terminal, and the switch unit may cause the first input terminal to be connected to the second output terminal and may cause the second input terminal to be open or to be connected to the first output terminal or the third output terminal in the second operation mode of the power amplifier. Accordingly, the impedance of the power amplifier circuit can be adjusted easily.

The above-described embodiments are given to facilitate the understanding of the present disclosure and are not intended to limit the present disclosure. The individual elements in the embodiments, and the arrangement, materials, conditions, shapes, sizes, and so forth thereof are not limited to the examples given above and can be changed as appropriate. Elements described in difference embodiments may be partially replaced or combined.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A power amplifier circuit comprising:
    a power amplifier configured to amplify an input signal and to output an amplified signal; and
    an output matching circuit electrically connected to an output end of the power amplifier, wherein:
    the output matching circuit comprises a first capacitor and a switch circuit,
    the first capacitor has a first end electrically connected to the output end of the power amplifier,
    the switch circuit comprises a first input terminal electrically connected to a second end of the first capacitor, a second input terminal electrically connected to the output end of the power amplifier, a first output terminal electrically connected to ground, and a second output terminal electrically connected to an output end of the output matching circuit, and
    the switch circuit is configured to:
        in a first operation mode of the power amplifier, cause the first input terminal to be connected to the first output terminal and cause the second input terminal to be connected to the second output terminal, and
        in a second operation mode of the power amplifier, cause the first input terminal to be connected to the second output terminal and cause the second input terminal to be open or to be connected to the first output terminal.

2. The power amplifier circuit according to claim 1, wherein:
    the output matching circuit further comprises a second capacitor,
    the second capacitor has a first end electrically connected to the output end of the power amplifier, and
    the second capacitor has a second end electrically connected to the second input terminal of the switch circuit.

3. The power amplifier circuit according to claim 1, wherein:
    the output matching circuit further comprises a third capacitor,
    the third capacitor has a first end electrically connected to the second output terminal of the switch circuit, and
    the third capacitor has a second end electrically connected to the output end of the output matching circuit.

4. The power amplifier circuit according to claim 2, wherein:
    the output matching circuit further comprises a third capacitor,
    the third capacitor has a first end electrically connected to the second output terminal of the switch circuit, and
    the third capacitor has a second end electrically connected to the output end of the output matching circuit.

5. The power amplifier circuit according to claim 1, wherein:
    the output matching circuit further comprises an inductor,
    the switch circuit further comprises a third output terminal electrically connected to ground,
    the inductor has a first end electrically connected to the third output terminal,
    the inductor has a second end electrically connected to ground, and
    in the second operation mode of the power amplifier, the switch circuit is configured to cause the first input terminal to be connected to the second output terminal and to cause the second input terminal to be open or to be connected to the first output terminal or to the third output terminal.

6. The power amplifier circuit according to claim 2, wherein:
the output matching circuit further comprises an inductor,
the switch circuit further comprises a third output terminal electrically connected to ground,
the inductor has a first end electrically connected to the third output terminal,
the inductor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

7. The power amplifier circuit according to claim 3, wherein:
the output matching circuit further comprises an inductor,
the switch circuit further comprises a third output terminal electrically connected to ground,
the inductor has a first end electrically connected to the third output terminal,
the inductor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

8. The power amplifier circuit according to claim 4, wherein:
the output matching circuit further comprises an inductor,
the switch circuit further comprises a third output terminal electrically connected to ground,
the inductor has a first end electrically connected to the third output terminal,
the inductor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

9. The power amplifier circuit according to claim 1, wherein:
the output matching circuit further comprises a fourth capacitor,
the switch circuit further comprises a third output terminal electrically connected to ground,
the fourth capacitor has a first end electrically connected to the third output terminal,
the fourth capacitor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

10. The power amplifier circuit according to claim 2, wherein:
the output matching circuit further comprises a fourth capacitor,
the switch circuit further comprises a third output terminal electrically connected to ground,
the fourth capacitor has a first end electrically connected to the third output terminal,
the fourth capacitor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

11. The power amplifier circuit according to claim 3, wherein:
the output matching circuit further comprises a fourth capacitor,
the switch circuit further comprises a third output terminal electrically connected to ground,
the fourth capacitor has a first end electrically connected to the third output terminal,
the fourth capacitor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

12. The power amplifier circuit according to claim 4, wherein:
the output matching circuit further comprises a fourth capacitor,
the switch circuit further comprises a third output terminal electrically connected to ground,
the fourth capacitor has a first end electrically connected to the third output terminal,
the fourth capacitor has a second end electrically connected to ground, and
in the second operation mode of the power amplifier, the switch circuit is configured to cause the first input terminal to be connected to the second output terminal and to cause the second input terminal to be open or to be connected to the first output terminal or to the third output terminal.

13. The power amplifier circuit according to claim 1, wherein:
the output matching circuit further comprises an open stub,
the switch circuit further comprises a third output terminal electrically connected to the open stub,
the open stub has a first end electrically connected to the third output terminal, and
in the second operation mode of the power amplifier, the switch circuit is configured to cause the first input terminal to be connected to the second output terminal and to cause the second input terminal to be open or to be connected to the first output terminal or to the third output terminal.

14. The power amplifier circuit according to claim 2, wherein:
the output matching circuit further comprises an open stub,
the switch circuit further comprises a third output terminal electrically connected to the open stub, the open stub has a first end electrically connected to the third output terminal, and in the second operation mode of the power amplifier, the switch circuit is configured to cause the first input terminal to be connected to the second output terminal and to cause the second input terminal to be open or to be connected to the first output terminal or to the third output terminal.

15. The power amplifier circuit according to claim 3, wherein:

the output matching circuit further comprises an open stub, the switch circuit further comprises a third output terminal electrically connected to the open stub, the open stub has a first end electrically connected to the third output terminal, and in the second operation mode of the power amplifier, the switch circuit is configured to cause the first input terminal to be connected to the second output terminal and to cause the second input terminal to be open or to be connected to the first output terminal or to the third output terminal.

16. The power amplifier circuit according to claim 4, wherein:

the output matching circuit further comprises an open stub, the switch circuit further comprises a third output terminal electrically connected to the open stub, the open stub has a first end electrically connected to the third output terminal, and in the second operation mode of the power amplifier, the switch circuit is configured to cause the first input terminal to be connected to the second output terminal and to cause the second input terminal to be open or to be connected to the first output terminal or to the third output terminal.

\* \* \* \* \*